(12) United States Patent
Lee et al.

(10) Patent No.: US 12,713,979 B2
(45) Date of Patent: Aug. 18, 2026

(54) SEMICONDUCTOR PACKAGES AND METHODS OF MANUFACTURING THE SEMICONDUCTOR PACKAGES

(71) Applicant: Samsung Electronics Co., Ltd., Suwon-si (KR)

(72) Inventors: Jeonghyun Lee, Suwon-si (KR); Jiyong Park, Suwon-si (KR); Jongbo Shim, Suwon-si (KR); Choongbin Yim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 529 days.

(21) Appl. No.: 18/124,183

(22) Filed: Mar. 21, 2023

(65) Prior Publication Data

US 2024/0063181 A1 Feb. 22, 2024

(30) Foreign Application Priority Data

Aug. 18, 2022 (KR) ........................ 10-2022-0103157

(51) Int. Cl.
*H10W 90/00* (2026.01)
*H10B 80/00* (2026.01)
(Continued)

(52) U.S. Cl.
CPC ............ *H10W 90/00* (2026.01); *H10B 80/00* (2023.02); *H10W 70/65* (2026.01);
(Continued)

(58) Field of Classification Search
CPC ........... H01L 25/0652; H01L 23/49838; H01L 24/08; H01L 24/16; H01L 24/32;
(Continued)

(56) References Cited

U.S. PATENT DOCUMENTS 8,598,698 B1 12/2013 Lim
9,402,312 B2 7/2016 Shen et al.
(Continued)

FOREIGN PATENT DOCUMENTS

KR 10-2019-0085656 A 7/2019
KR 10-2019-0088810 A 7/2019
(Continued)

*Primary Examiner* — Benjamin Tzu-Hung Liu
(74) *Attorney, Agent, or Firm* — Wolf, Greenfield & Sacks, P.C.

(57) ABSTRACT

A semiconductor package may include a package substrate having a first surface and a second surface vertically opposite to each other, a first mounting region and a second mounting region horizontally spaced apart from each other, and first and second semiconductor devices respectively mounted on the first and second mounting regions on the first surface of the package substrate. The package substrate may include wiring patterns electrically connected to the first and second semiconductor devices, dummy patterns electrically insulated from the first and second semiconductor devices, and a reinforcing structure that extends along perimeters of the first and second mounting regions on the first surface of the package substrate, and is bonded to at least portions of the dummy patterns.

19 Claims, 20 Drawing Sheets

(51) Int. Cl.
*H10W 70/65* (2026.01)
*H10W 72/90* (2026.01)
*H10W 80/00* (2026.01)

(52) U.S. Cl.
CPC ...... *H10W 72/9415* (2026.01); *H10W 80/743* (2026.01); *H10W 90/722* (2026.01); *H10W 90/724* (2026.01); *H10W 90/734* (2026.01); *H10W 90/754* (2026.01)

(58) Field of Classification Search
CPC ................. H01L 24/48; H01L 25/0655; H01L 2224/08112; H01L 2224/16145; H01L 2224/16227; H01L 2224/32227; H01L 2224/48228; H01L 2924/1431; H01L 2924/143; H10B 80/00; H10W 90/00; H10W 70/65; H10W 72/9415; H10W 80/743; H10W 90/722; H10W 90/724; H10W 90/734; H10W 90/754
See application file for complete search history.

(56) References Cited

U.S. PATENT DOCUMENTS

| | | | | |
|---|---|---|---|---|
| 11,277,917 | B2 | 3/2022 | Liao et al. | |
| 2011/0024898 | A1 | 2/2011 | Leung et al. | |
| 2016/0064309 | A1* | 3/2016 | Su | H01L 25/50 257/773 |
| 2019/0229070 | A1* | 7/2019 | Kwon | H10W 42/121 |
| 2022/0068843 | A1 | 3/2022 | Lim et al. | |
| 2022/0077076 | A1 | 3/2022 | Sinha et al. | |
| 2022/0181309 | A1 | 6/2022 | Lee et al. | |
| 2023/0063692 | A1* | 3/2023 | Wang | H10D 88/00 |
| 2024/0063098 | A1* | 2/2024 | Liu | H01L 21/568 |

FOREIGN PATENT DOCUMENTS

| | | | |
|---|---|---|---|
| KR | 10-2021-0041929 | A | 4/2021 |
| KR | 20220081445 | A | 6/2022 |

* cited by examiner 10
100
A'
A
300
200
420
410
400

SEMICONDUCTOR PACKAGES AND METHODS OF MANUFACTURING THE SEMICONDUCTOR PACKAGES

CROSS-REFERENCE TO RELATED APPLICATION

This application claims priority under 35 U.S.C. § 119 to Korean Patent Application No. 10-2022-0103157, filed on Aug. 18, 2022, in the Korean Intellectual Property Office (KIPO), and the entire contents of the above-identified application are herein incorporated by reference.

BACKGROUND

1. Field

Example embodiments relate to semiconductor packages and to methods of manufacturing the semiconductor package. More particularly, example embodiments relate to semiconductor packages including a plurality of semiconductor devices spaced apart from each other and to methods of manufacturing the same.

2. Description of the Related Art

In a system in package (SiP), a plurality of semiconductor devices may be mounted together on one semiconductor substrate through flip chip bonding technology. When the plurality of the semiconductor device is mounted on the one semiconductor substrate, warpage of the semiconductor substrate may occur. In addition, there may be a problem in dissipating heat generated from a plurality of semiconductor devices.

SUMMARY

Example embodiments provide semiconductor packages that include reinforcing structures to prevent warpage and increase thermal conductivity.

Example embodiments provide methods of manufacturing the semiconductor packages.

According to some example embodiments, a semiconductor package may include a package substrate having a first surface and a second surface vertically opposite to each other, and having a first mounting region and a second mounting region horizontally spaced apart from each other, and first and second semiconductor devices respectively mounted on the first and second mounting regions on the first surface of the package substrate. The package substrate may include wiring patterns electrically connected to the first and second semiconductor devices, dummy patterns electrically insulated from the first and second semiconductor devices, and a reinforcing structure that extends along perimeters of the first and second mounting regions on the first surface of the package substrate, and bonded to at least portions of the dummy patterns.

According to some example embodiments, a semiconductor package may include a package substrate having first and second surfaces vertically opposite to each other, and a semiconductor device on the first surface of the package substrate. The package substrate may include a reinforcing structure that extends from the first surface along a perimeter of the semiconductor device, first conductive patterns electrically connected to the semiconductor device, and second conductive patterns bonded to the reinforcing structure and electrically insulated from the semiconductor device.

According to some example embodiments, a semiconductor package may include a package substrate having first and second surfaces vertically opposite to each other, and first and second semiconductor devices spaced apart from each other on the first surface of the package substrate. the package substrate includes a trench formed in the first surface and extending along a perimeter of each of the first and second semiconductor devices, the trench having a upper portion open to the first surface and a lower portion opposite to the upper portion, wiring patterns electrically connected to the first and second semiconductor devices, dummy patterns exposed from the lower portion of the trench and electrically insulated from the first and second semiconductor devices, and a reinforcing structure provided to fill the trench.

Thus, the reinforcing structure may be provided inside the package substrate to support the package substrate. The reinforcing structure may prevent warpage of the package substrate caused by the weight of the first and second semiconductor devices. When the reinforcing structure is bonded to at least the portion of the dummy patterns, the reinforcing structure may be fixed (e.g., strongly fixed) to the inside of the package substrate to increase supporting force.

In addition, since the reinforcing structure may be buried in the first surface of the package substrate, a size of the semiconductor package may be maintained while increasing a size of the reinforcing structure. Since the reinforcing structure may include a metal material having high thermal conductivity, heat generated from the first and second semiconductors may be discharged to outside the semiconductor package.

BRIEF DESCRIPTION OF THE DRAWINGS

Some example embodiments will be understood more clearly from the following detailed description taken in conjunction with the accompanying drawings. FIGS. 1 to 19 represent non-limiting, example embodiments as described herein.

FIG. 1 is a plan view illustrating a semiconductor package in accordance with some example embodiments.

FIG. 2 is a cross-sectional view taken along the line A-A' in FIG. 1.

FIG. 3 is an enlarged cross-sectional view illustrating portion 'B' in FIG. 2.

FIGS. 4, 5, 6, 7, 8, 9, 10, 11, 12A and 12B are views illustrating a method of manufacturing a semiconductor package in accordance with example embodiments.

FIG. 13 is a plan view illustrating a semiconductor package having a protruding reinforcing structure in accordance with some example embodiments.

FIG. 14 is a cross-sectional view taken along the line D-D' in FIG. 13.

FIG. 15 is an enlarged cross-sectional view illustrating portion 'E' in FIG. 14.

FIGS. 16, 17, 18, and 19 are cross-sectional views illustrating a method of manufacturing the semiconductor package in FIG. 13 in accordance with some example embodiments.

DETAILED DESCRIPTION OF EXAMPLE EMBODIMENTS

Hereinafter, some example embodiments will be explained in detail with reference to the accompanying drawings.

Figure 1:
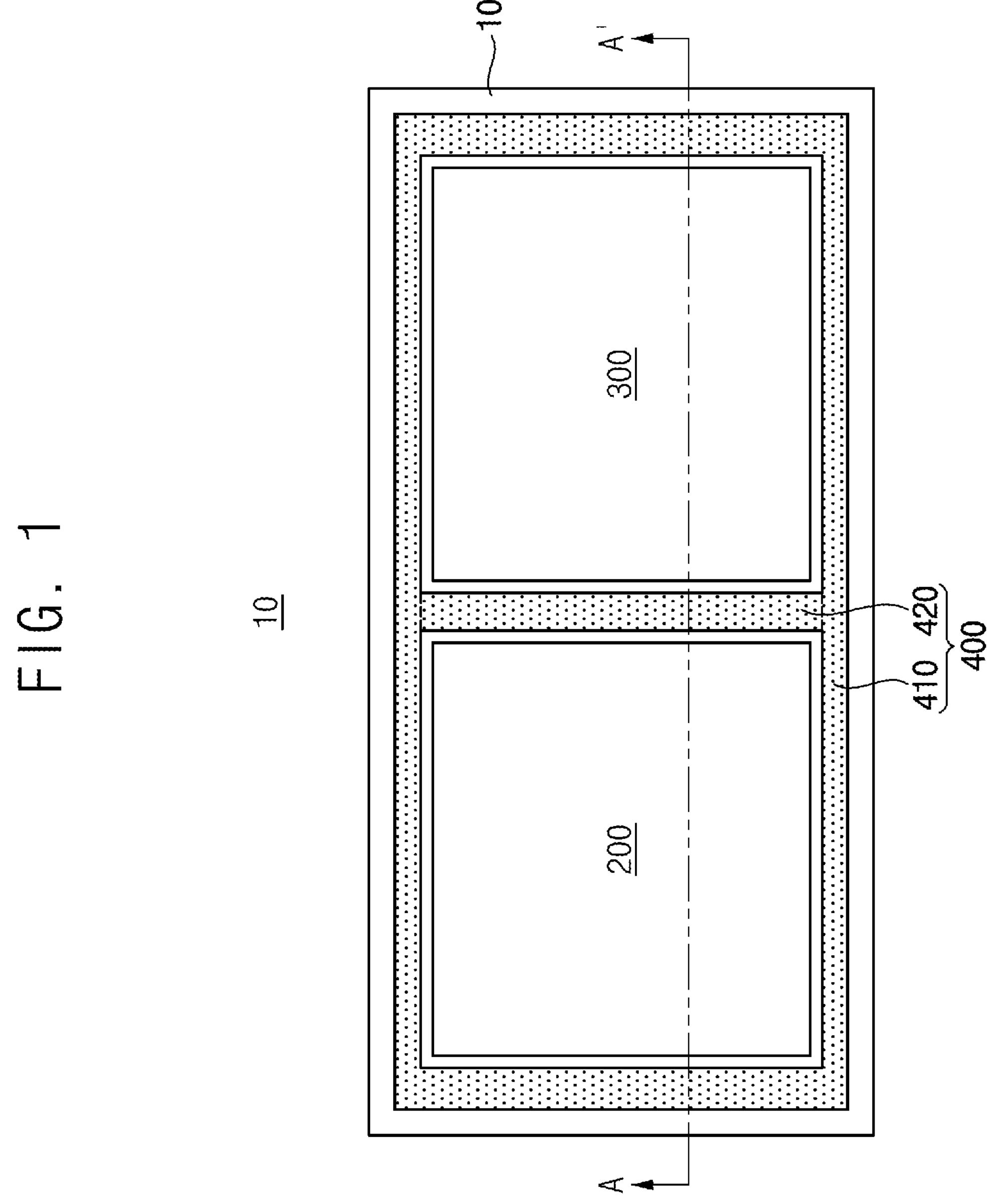
Figure 2:
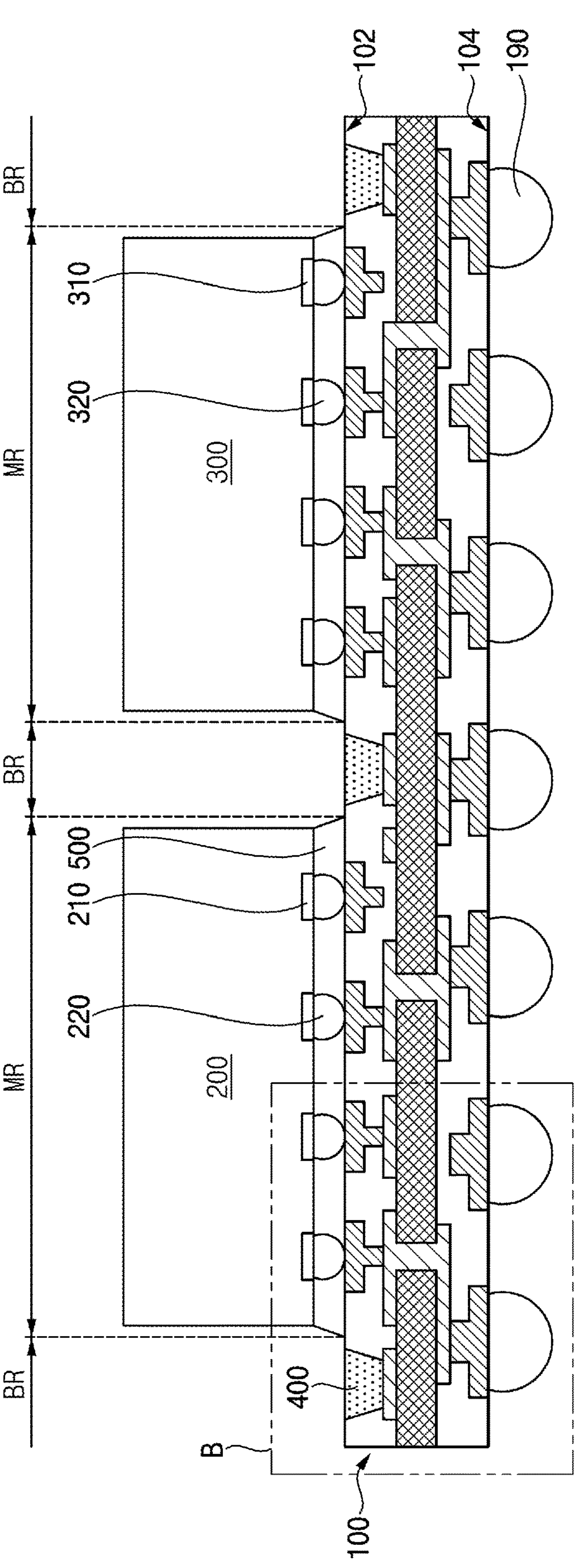
Figure 3:
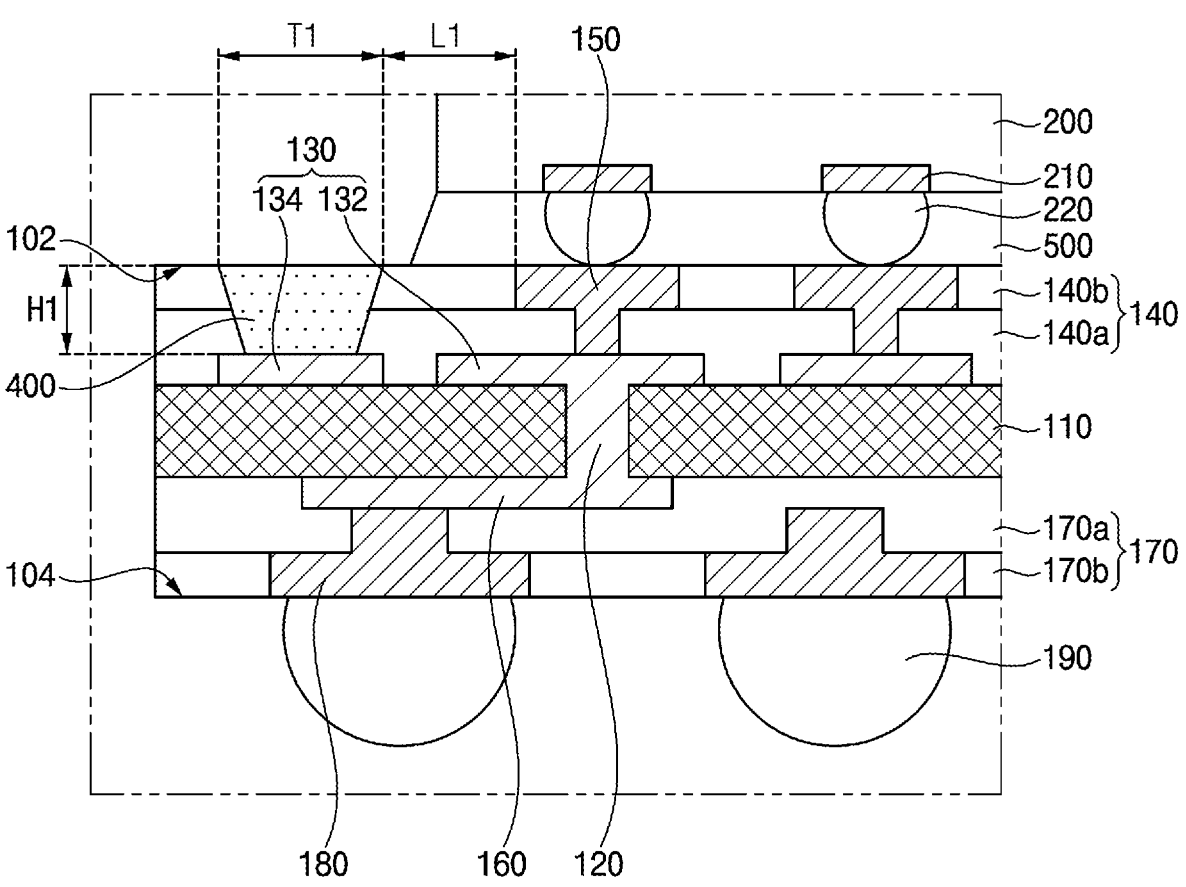

FIG. 1 is a plan view illustrating a semiconductor package in accordance with example embodiments. FIG. 2 is a cross-sectional view taken along the line A-A' in FIG. 1. FIG. 3 is an enlarged cross-sectional view illustrating portion 'B' in FIG. 2.

Referring to FIGS. 1 to 3, a semiconductor package 10 may include a package substrate 100, and first and second semiconductor devices 200, 300 on the package substrate 100 and spaced apart from each other in a horizontal direction.

In example embodiments, the semiconductor package 10 may be a memory module having a stacked chip structure in which a plurality of dies (chips) is stacked. For example, the semiconductor package 10 may include a semiconductor memory device having a 2.5D chip structure. In this case, the first semiconductor device 200 may include a logic semiconductor device, and the second semiconductor device 300 may include a memory device. The logic semiconductor device may include an ASIC as a host such as a CPU, GPU, or SoC. The memory device may include a high bandwidth memory (HBM) device, a dynamic random access memory (DRAM), and the like. Alternatively, the semiconductor package 10 may include a semiconductor memory device having a 3D chip structure.

The first and second semiconductor devices 200 and 300 may be spaced apart from each other on the package substrate 100. A plane region or planar area of each of the first and second semiconductor devices 200 and 300 may be smaller than a plane region or planar area of the package substrate 100. When viewed from a plan view, the first and second semiconductor devices 200 and 300 may be within the region of the package substrate 100.

Hereinafter, a case in which the semiconductor package 10 is a semiconductor memory device having a 2.5D chip structure will be described. However, it may be understood that the semiconductor package 10 according to some exemplary embodiments is not limited to the semiconductor memory device having the 2.5D chip structure.

In example embodiments, the package substrate 100 may include an upper surface 102 and a lower surface 104 opposite to each other. The upper surface 102 may be a first surface and the lower surface 104 may be a second surface that is opposite to the first surface, e.g., opposite to the first surface in a vertical direction. The package substrate 100 may arrange the first and second semiconductor devices 200, 300 on the upper surface 102 and the first and second semiconductor devices 200, 300 may be electrically connected to each other via the package substrate 100. For example, the package substrate 100 may be a printed circuit board (PCB). The printed circuit board may be a multilayer circuit board having vias and various circuits therein.

The first and second semiconductor devices 200, 300 may be connected to each other through circuits inside the package substrate 100. The first semiconductor device 200 may include at least one first conductive bump 220 provided on a first chip pad 210 on a lower surface. The second semiconductor device 300 may include at least one second conductive bump 320 provided on a second chip pad 310 on a lower surface. Each of the first and second semiconductor devices 200, 300 may be mounted on the package substrate 100 and electrically connected to each other via the first and second conductive bumps 220, 320. The number of first conductive bumps 220 may not be equal to the number of second conductive bumps 320. The package substrate 100 may provide a high-density interconnection between the first and second semiconductor devices 200, 300.

The first semiconductor device 200 may have a first mass. The second semiconductor device 300 may have a second mass different from the first mass. When the first and second semiconductor devices 200, 300 have different masses, a center of gravity of the package substrate 100 may be biased in one direction. When the center of gravity of the package substrate 100 is biased, a warpage phenomenon may occur in the package substrate 100.

The package substrate 100 may include a plurality of mounting regions MR and a boundary region BR between the mounting regions MR. The mounting regions MR may be regions formed by performing a packaging process on the package substrate 100, and at least one semiconductor chip may be provided in each of the mounting regions MR. The first and second semiconductor devices 200, 300 may be respectively provided on the first and second mounting regions MR.

The mounting regions MR may be arranged at predetermined intervals. For example, each of the mounting regions MR may have a substantially rectangular shape. The boundary region BR may have a structure surrounding the mounting regions MR. In the present embodiment, although the number of mounting areas MR is illustratively illustrated as two, it may be understood that the number of mounting areas MR is not limited thereto.

As seen in FIG. 3, the package substrate 100 may include a core layer 110, a conductive through via 120, an upper conductive pattern 130, an upper insulating layer 140, a plurality of upper bonding pads 150, a lower conductive pattern 160, a lower insulating layer 170, a plurality of lower bonding pads 180, a plurality of external connection bumps 190, and a reinforcing structure 400.

The core layer 110 may include a non-conductive material layer. The core layer 110 may include a reinforced polymer or the like. The core layer 110 may serve as a boundary that divides an upper portion and a lower portion of the package substrate 100.

The conductive through via 120 may penetrate or extend through the core layer 110 and electrically connect the upper conductive pattern 130 and the lower conductive pattern 160. When the first and second semiconductor devices 200, 300 are mounted on the upper surface 102 of the package substrate 100, the conductive through via 120 may electrically connect the first and second semiconductor devices 200, 300 to other semiconductor devices provided on the lower surface 104 of the package substrate 100.

The upper insulating layer 140 may include first and second upper insulating layers 140*a*, 140*b*. The upper insulating layer may include a polymer or a dielectric layer. The upper insulating layer may be formed by a vapor deposition process, a spin coating process, or the like.

The upper conductive pattern 130 may be provided in the upper insulating layer 140. The upper conductive pattern 130 may include a wiring pattern 132 and a dummy pattern 134. The wiring pattern 132 may electrically connect the first and second semiconductor devices 200, 300. An electrical signal may move or travel inside the wiring pattern 132. The electrical signal may not move or travel in the dummy pattern 134. The dummy pattern 134 may be electrically insulated from the first and second semiconductor devices 200, 300. The upper conductive pattern may include aluminum (Al), copper (Cu), tin (Sn), nickel (Ni), gold (Au), platinum (Pt), or an alloy thereof. The upper conductive pattern may be formed by a plating process, an electroless plating process, a vapor deposition process, or the like.

Specifically, the upper conductive pattern 130 may be provided in the first upper insulating layer 140*a*. A lower surface of the upper conductive pattern 130 may be exposed from the first upper insulating layer 140*a*. The upper conductive pattern 130 may extend in a longitudinal direction of the core layer 110 within the first upper insulating layer 140*a*. The lower surface of the upper conductive pattern 130 may contact the core layer 110 (e.g., the lower surface of the upper conductive pattern 130 may directly contact the core layer 110).

The first upper insulating layer 140*a* may have a first opening exposing an upper surface of the wiring pattern 132 of the upper conductive pattern 130. The first upper insulating layer 140*a* may have a first trench exposing an upper surface of the dummy pattern 134 of the upper conductive pattern 130.

The upper bonding pad 150 may be provided on the first upper insulating layer 140*a* and may contact the upper conductive pattern 130 through the first opening. The upper bonding pad 150 may contact the wiring pattern 132 of the upper conductive pattern 130 through the first opening.

The second upper insulating layer 140*b* may be provided on the first upper insulating layer 140*a* and may have a second opening exposing the upper bonding pad 150. Accordingly, the plurality of upper bonding pads 150 may be exposed from or by an upper surface of the second upper insulating layer 140*b*.

The second upper insulating layer 140*b* may have a second trench provided on the first upper insulating layer 140*a* and exposing the reinforcing structure 400. Accordingly, the reinforcing structure 400 may be exposed from the upper surface of the second upper insulating layer 140*b*.

The lower insulating layer 170 may include first and second lower insulating layers 170*a*, 170*b*. The lower insulating layer may include a polymer or a dielectric layer. The lower insulating layer may be formed by a vapor deposition process, a spin coating process, or the like.

The lower conductive pattern 160 may be provided in the lower insulating layer 170. The lower conductive pattern may include aluminum (Al), copper (Cu), tin (Sn), nickel (Ni), gold (Au), platinum (Pt), or an alloy thereof. The lower conductive pattern may be formed by a plating process, an electroless plating process, a vapor deposition process, or the like.

Specifically, the lower conductive pattern 160 may be provided in the first lower insulating layer 170*a*. An upper surface of the lower conductive pattern 160 may be exposed from the first lower insulating layer 170*a*. The lower conductive pattern 160 may extend in the longitudinal direction of the core layer 110 within the first lower insulating layer 170*a*. The upper surface of the lower conductive pattern 160 may contact the core layer 110 (e.g., the upper surface of the lower conductive pattern 160 may directly contact the core layer 110). The first lower insulating layer 170*a* may have a third opening exposing a lower surface of the lower conductive pattern 160.

The lower bonding pad 180 may be provided on the first lower insulating layer 170*a* and may contact the lower conductive pattern 160 through the third opening. The lower bonding pad 180 may contact the lower conductive pattern 160 through the third opening. The second lower insulating layer 170*b* may be provided on the first lower insulating layer 170*a* and may have a fourth opening exposing the lower bonding pad 180. Accordingly, the plurality of lower bonding pads 180 may be exposed from the lower surface of the second lower insulating layer 170*b*.

The lower bonding pads 180 may be provided on the lower surface 104 of the package substrate 100, and external connection bumps 190 may be on the lower bonding pads 180 to electrically connect to external devices. For example, the external connection bumps 190 may be solder balls. The semiconductor package 10 may be mounted on a module substrate (not shown) via the solder balls to form a memory module.

In example embodiments, the reinforcing structure 400 may extend inside the package substrate 100. The reinforcing structure 400 may extend in the boundary region BR between the mounting regions MR. The reinforcing structure 400 may extend along outer sides of each of the first and second semiconductor devices 200, 300 from the upper surface 102 of the package substrate 100. The reinforcing structure 400 may extend along perimeters or circumferences of the mounting regions MR on the upper surface 102 of the package substrate 100.

The reinforcing structure 400 may include a first stiffener 410 extending along an outside of the package substrate 100 and a second stiffener 420 branching from the first stiffener 410. The first stiffener 410 may support the outside of the package substrate 100. The second stiffener 420 may extend from an inner surface of the first stiffener 410 and may support twisting of the first stiffener 410. The second stiffener 420 may extend between the first and second semiconductor devices 200, 300. The first and second stiffeners 410, 420 may support force applied to the outside of the package substrate 100 to prevent the warpage phenomenon of the package substrate 100.

The reinforcing structure 400 may be provided on the first upper insulating layer 140*a* and may contact the dummy pattern 134 of the upper conductive pattern 130 through the first trench. The reinforcing structure 400 may not contact the wiring pattern 132 of the upper conductive pattern 130. Therefore, the electrical signal may not move to the reinforcing structure 400. The reinforcing structure 400 may be bonded to the dummy pattern 134 and more strongly fixed in the package substrate 100. The reinforcing structure 400 may be supported by the dummy pattern 134 to provide stronger support to the package substrate 100 inside the package substrate 100.

The reinforcing structure 400 may be provided inside the upper insulating layer 140. An upper surface of the reinforcing structure 400 may be exposed to the upper surface 102 of the package substrate 100 through the second opening of the second upper insulating layer 140*b*. The reinforcing structure 400 may dissipate heat generated inside the package substrate 100 to the outside through the exposed upper surface.

The reinforcing structure 400 may be spaced apart by a first distance L1 from the upper bonding pads 150 to which the first and second conductive bumps 220, 320 of the first and second semiconductor devices 200, 300 are respectively bonded. When the reinforcing structure 400 is spaced apart by a first distance L1 from the upper bonding pads 150 bonded to the first and second conductive bumps 220, 320, a short phenomenon occurring between the reinforcing structure 400 and the first and second conductive bumps 220, 320 may be prevented. For example, the first distance L1 may be within a range of 30 μm to 500 μm.

In some embodiments, the reinforcing structure 400 may overlap at least a portion of the first and second semiconductor devices 200, 300 when viewed from a plan view. When the reinforcing structure 400 has the portion overlapping the first and second semiconductor devices 200, 300 in the plan view, the reinforcing structure 400 may efficiently support the force applied on the package substrate 100 by weights of the first and second semiconductor devices 200, 300.

The reinforcing structure 400 may have a size sufficient to support the inside of the package substrate 100 and dissipate heat generated from the inside of the package substrate 100. The reinforcing structure 400 may have a first height H1 and a first width T1 and may be buried in the package substrate 100. For example, the first width T1 of the reinforcing structure 400 may be within a range of 200 μm to 500 μm. The first height H1 of the reinforcing structure 400 may be within a range of 10 μm to 30 μm.

A cross-sectional shape of the reinforcing structure 400 may include a trapezoidal shape. The cross-sectional shape of the reinforcing structure 400 may include an isosceles trapezoidal shape. The reinforcing structure 400 may be strongly adhered to the dummy pattern 134 of the upper conductive pattern 130 through the trapezoidal shape, and may increase heating effect through a wide upper region.

The reinforcing structure 400 may include a metal material. The reinforcing structure 400 may increase the heating effect through the metal material. For example, the metal material may include copper (Cu), aluminum (Al), tungsten (W), nickel (Ni), molybdenum (Mo), gold (Au), silver (Ag), chromium (Cr), tin (Sn) and titanium (Ti).

As described above, the reinforcing structure 400 may be provided inside the package substrate 100 and may support the package substrate 100. The reinforcing structure 400 may prevent the warpage phenomenon of the package substrate 100 caused by the weights of the first and second semiconductor devices 200, 300. Since the reinforcing structure 400 is bonded to at least portion of the dummy pattern 134, the reinforcing structure 400 may be fixed (e.g., strongly fixed) to the inside of the package substrate 100 and may increase a supporting force.

In addition, since the reinforcing structure 400 may be buried in the upper surface 102 of the package substrate 100, a size of the semiconductor package 10 may be maintained while increasing the size of the reinforcing structure 400. Since the reinforcing structure 400 may include a metal material having high thermal conductivity, the heat generated from the first and second semiconductor devices 200, 300 may be discharged or expelled to the outside.

Hereinafter, a method of manufacturing the semiconductor package in FIG. 1 will be described.

Figure 7:
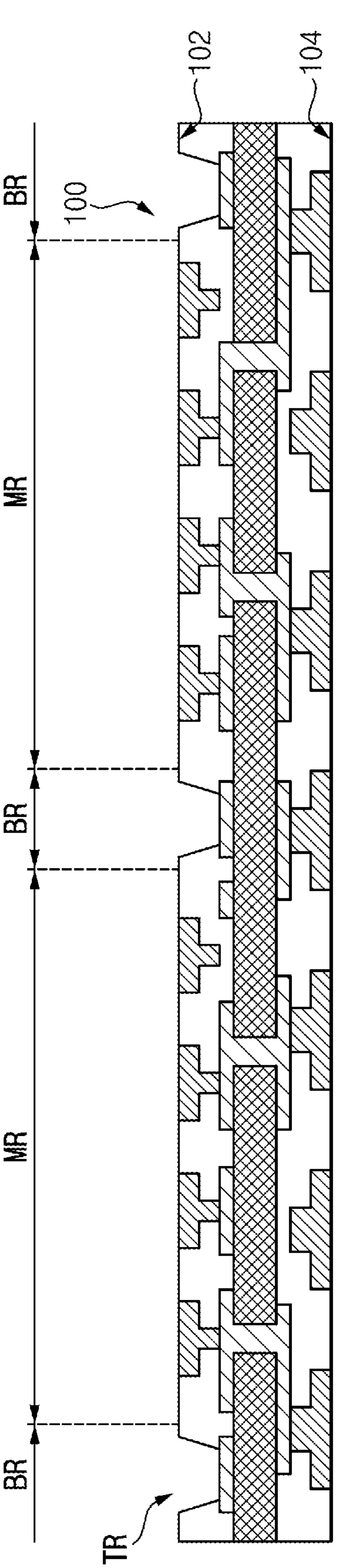
Figure 8:
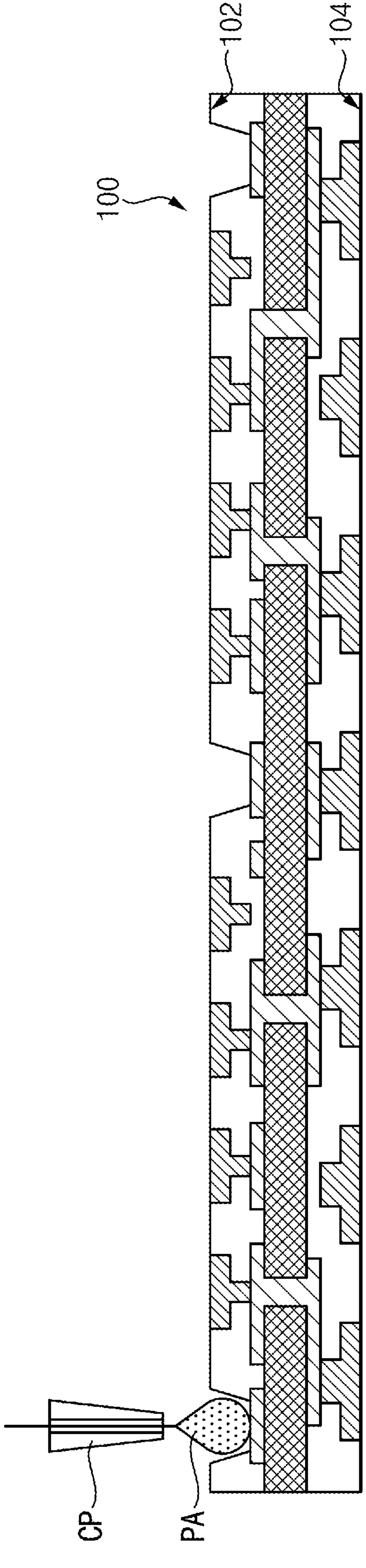
Figure 9:
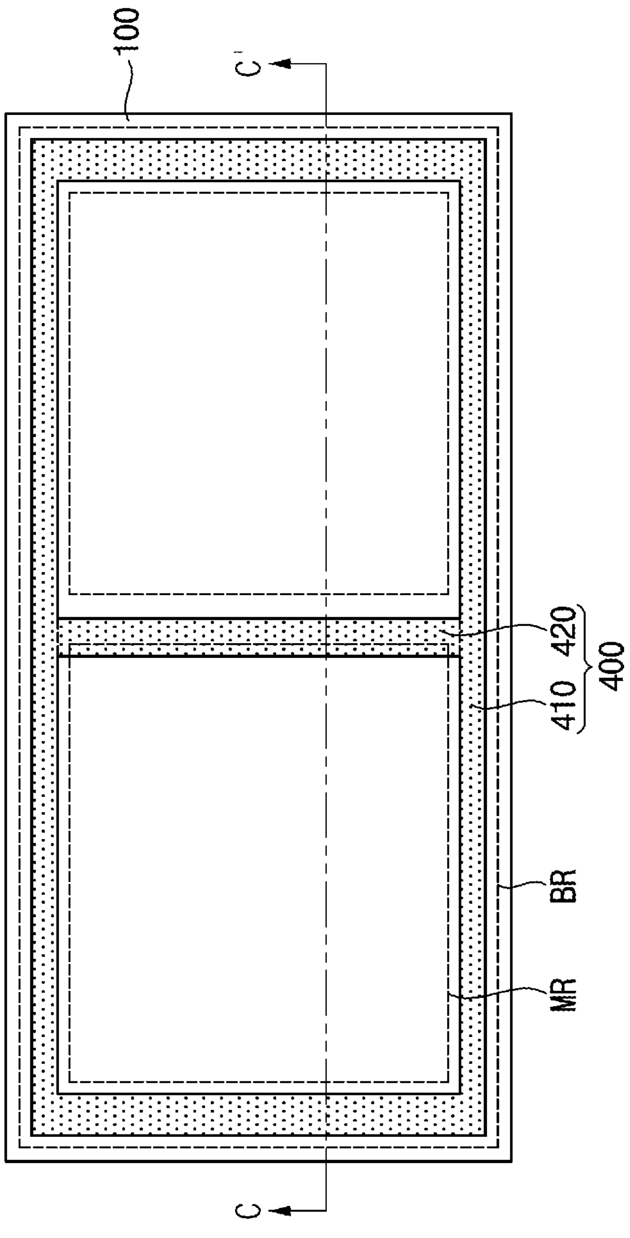
Figure 10:
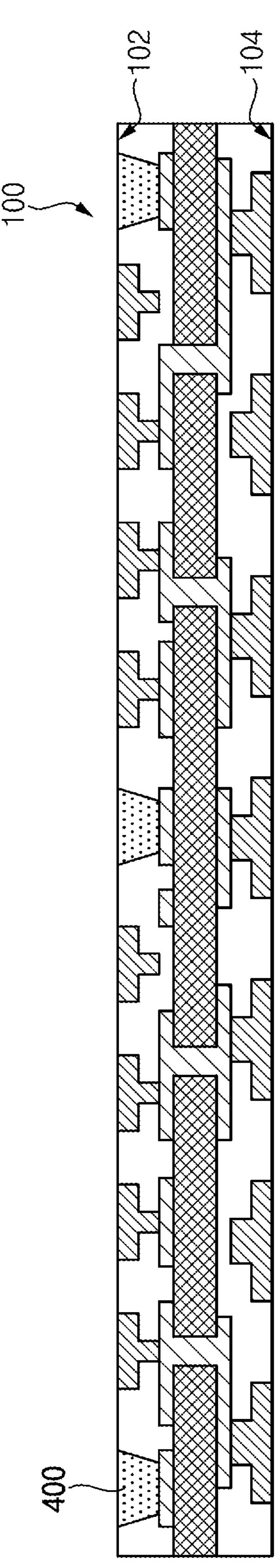
Figure 11:
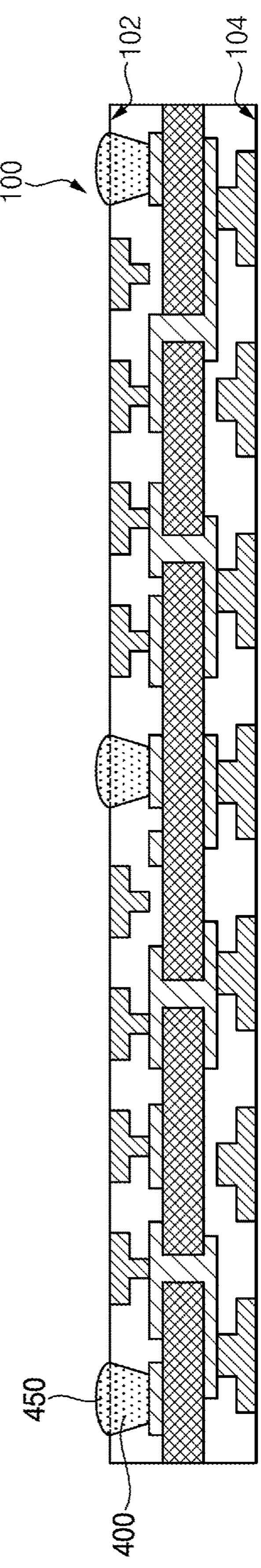

FIGS. 4 to 12B are views illustrating a method of manufacturing a semiconductor package in accordance with example embodiments. FIG. 9 is a plan view illustrating a package substrate on which a reinforcing structure is formed. FIGS. 10 and 11 are cross-sectional views taken along the line C-C' in FIG. 9.

Figure 4:
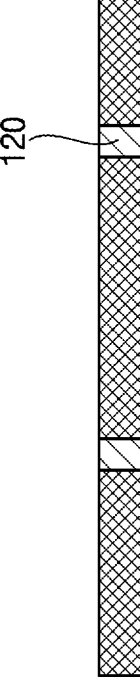
Figure 5:
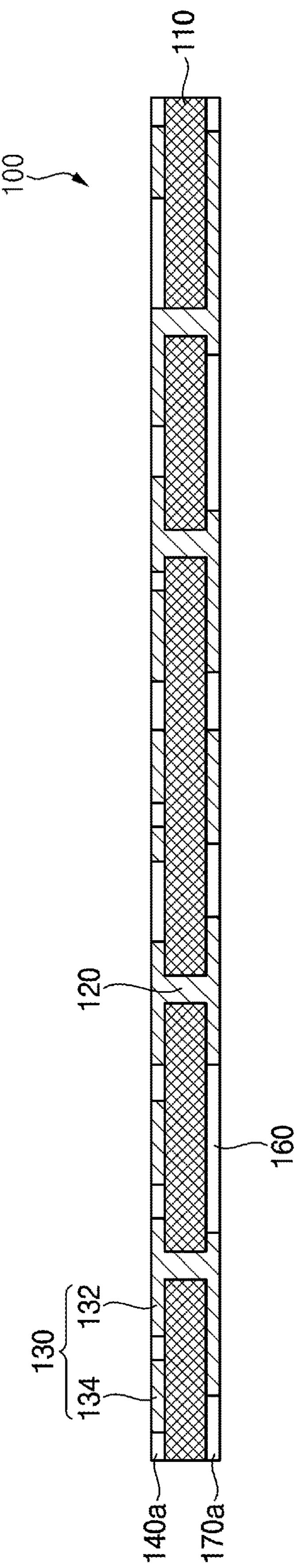
Figure 6:
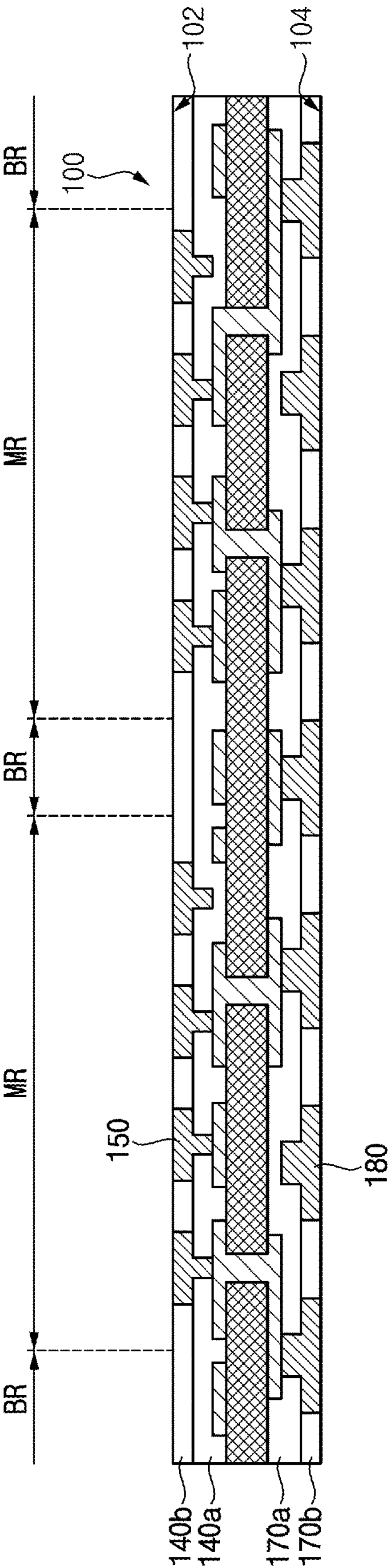

Referring to FIGS. 4 to 6, a package substrate 100 including a core layer 110 and conductive through vias 120 penetrating or extending through the core layer 110 may be formed.

The core layer 110 may include a non-conductive material layer. The core layer 110 may serve as a boundary that divides an upper portion and a lower portion of the package substrate 100.

As illustrated in FIG. 4, the conductive through via 120 may penetrate or extend through the core layer 110 and may electrically connect an upper conductive pattern 130 and a lower conductive pattern 160 to be subsequently formed. Subsequently, when the first and second semiconductor devices 200, 300 are mounted on an upper surface 102 of the package substrate 100, the conductive through via 120 may electrically connect the first and second semiconductor devices 200, 300 and other semiconductor devices provided on a lower surface 104 of the package substrate 100.

As illustrated in FIGS. 5 and 6, a first upper insulating layer **140*a* covering an upper surface of the core layer 110 may be formed, a first lower insulating layer 170*a* covering a lower surface of the core layer 110 may be formed. Upper patterns (or openings) exposing the upper surface of the core layer 110 may be formed by patterning the first upper insulating layer 140*a*, lower patterns (or openings) exposing the lower surface of the core layer 110 may be formed by patterning the first lower insulating layer 170*a***.

For example, the first upper insulating layer **140*a* and the first lower insulating layer 170*a* may include a polymer or a dielectric layer. Specifically, the first upper insulating layer 140*a* and the first lower insulating layer 170*a* may include polyimide (PI), lead oxide (PbO), polyhydroxystyrene (PHS), novolac, or the like. The first upper insulating layer 140*a* and the first lower insulating layer 170*a*** may be formed by a vapor deposition process, a spin coating process, or the like.

The upper conductive patterns 130 that contact (e.g., that directly contact) the core layer 110 through the upper patterns or openings may be formed on the first upper insulating layer **140*a*. The upper conductive patterns 130 may be formed by performing a first plating process on the first upper insulating layer 140*a***. The first plating process may include an electrolytic plating process or an electroless plating process.

The lower conductive patterns 160 that contact (e.g., that directly contact) the core layer 110 through the lower patterns or openings may be formed on the first lower insulating layer **170*a*. The lower conductive patterns 160 may be formed by performing a second plating process on the first lower insulating layer 170*a***. The second plating process may include an electrolytic plating process or an electroless plating process.

The upper conductive patterns 130 may be formed in mounting regions MR where the first and second semiconductor devices 200, 300 are mounted. For example, the upper and lower conductive patterns 160 may include aluminum (Al), copper (Cu), tin (Sn), nickel (Ni), gold (Au), platinum (Pt), or an alloy thereof.

Then, after forming a second upper insulating layer **140*b* covering the upper conductive patterns 130 on the first upper insulating layer 140*a*, first openings exposing the upper conductive patterns 130 may be formed by patterning the second upper insulating layer 140*b*. Upper bonding pads 150 contacting (e.g., directly contacting) the upper conductive patterns 130 may be formed on the second upper insulating layer 140*b*** through the first openings.

After forming a second lower insulating layer **170*b* covering the lower conductive patterns 160 on the first lower insulating layer 170*a*, third openings exposing the lower conductive patterns 160 may be formed by patterning the second lower insulating layer 170*b*. Lower bonding pads 180 contacting (e.g., directly contacting) the lower conductive patterns 160 may be formed on the second lower insulating layer 170*b*** through the third openings.

For example, the upper and lower bonding pads 150, 180 may include aluminum (Al), copper (Cu), tin (Sn), nickel (Ni), gold (Au), platinum (Pt), or an alloy thereof.

Referring to FIGS. 7 to 11, a reinforcing structure 400 may be formed on the upper surface 102 of the package substrate 100.

As illustrated in FIG. 7, a trench TR may be formed on the upper surface 102 of the package substrate 100. The trench TR may be formed in a boundary region BR that surrounds the mounting regions MR (e.g., that surrounds each of the mounting regions MR). The trench TR may extend to a region where warpage occurs or more easily occurs on the package substrate 100. The trench TR may extend in regions not in contact with the wiring patterns 132 of the upper conductive pattern 130. Dummy patterns 134 of the upper conductive pattern 130 may be exposed on a lower surface of the trench TR.

The trench TR may be formed by selectively removing a portion of the upper insulating layer 140. The trench TR may be formed in the upper insulating layer 140 through a wet etching process, a dry etching process, or a plasma etching process.

The wet etching process may be performed using an etchant having an etching selectivity with respect to the upper insulating layer 140. For example, the etchant may include water ($H_2O$), hydrogen peroxide ($H_2O_2$), citric acid ($C_6H_8O_7$), and the like. The portion of the upper insulating layer 140 may be removed by the wet etching process.

For example, the plasma etching process may be performed using inductively coupled plasma, capacitively coupled plasma, microwave plasma, or the like.

As illustrated in FIG. 8, a paste PA may be filled in the trench TR. The paste PA may be withdrawn from an ejector CP.

The paste PA may include metal particles. The paste PA may be sintered through a reflow process, a curing process, or the like. In a process of sintering the paste PA, additives may be removed and only the metal particles may remain. The metal particle may be hardened inside the trench TR and may have rigidity.

For example, the metal particles may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), or alloys thereof.

As illustrated in FIGS. 9 to 10, the reinforcing structure 400 may be formed inside the trench TR.

The paste PA may be sintered inside the trench TR to form the reinforcing structure 400. The paste PA may be sintered on the dummy pattern 134 of the upper conductive pattern 130 to be bonded (e.g., strongly bonded) to the dummy pattern 134. The reinforcing structure 400 may be bonded (e.g., strongly bonded) to the dummy pattern 134 and may have a relatively strong supporting capacity.

The reinforcing structure 400 may be formed in the boundary region BR surrounding the mounting regions MR. The reinforcing structure 400 may extend to the region where warpage occurs on the package substrate 100 (e.g., where warpage occurs relatively easily). The reinforcing structure 400 may extend in regions that are not in contact with the wiring patterns 132.

In some embodiments, the reinforcing structure 400 may overlap at least a portion of the first and second semiconductor devices 200, 300 when viewed from a plan view. The reinforcing structure 400 may be formed to overlap at least a portion of the mounting regions MR. When the reinforcing structure 400 has the portion overlapping the first and second semiconductor devices 200, 300 in the plan view, the reinforcing structure 400 may efficiently support force applied on the package substrate 100 by weights of the first and second semiconductor devices 200, 300.

The reinforcing structure 400 may be formed such that an upper surface is exposed from the upper surface 102 of the package substrate 100. The reinforcing structure 400 may discharge heat generated inside the package substrate 100 to an outside through the exposed upper surface 102.

A cross-sectional shape of the reinforcing structure 400 may include a trapezoidal shape. The cross-sectional shape of the reinforcing structure 400 may include an isosceles trapezoidal shape. The reinforcing structure 400 may be strongly adhered to the dummy pattern 134 of the upper conductive pattern 130 through the trapezoidal shape, and may increase heating effect through a wide upper region.

For example, the reinforcing structure 400 may include nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), or alloys thereof.

As seen in FIG. 11, when an amount the paste PA flows into the trench TR that exceeds a storage capacity or volume of the trench TR, the paste PA may have a protruding shape.

When the paste PA is sintered with the protruding shape, the reinforcing structure 400 may have a protrusion 450 that protrudes from or extends above the upper surface 102 of the package substrate 100. The reinforcing structure 400 may increase a surface area in contact with air through the protrusion 450. The reinforcing structure 400 may effectively discharge the heat generated inside the package substrate 100 through the protrusion 450.

The reinforcing structure 400 may have an increased volume through the protrusion 450. The reinforcing structure 400 may have stronger rigidity through the increased volume, and the reinforcing structure 400 may provide stronger support to an inside of the package substrate 100.

Figure 12A:
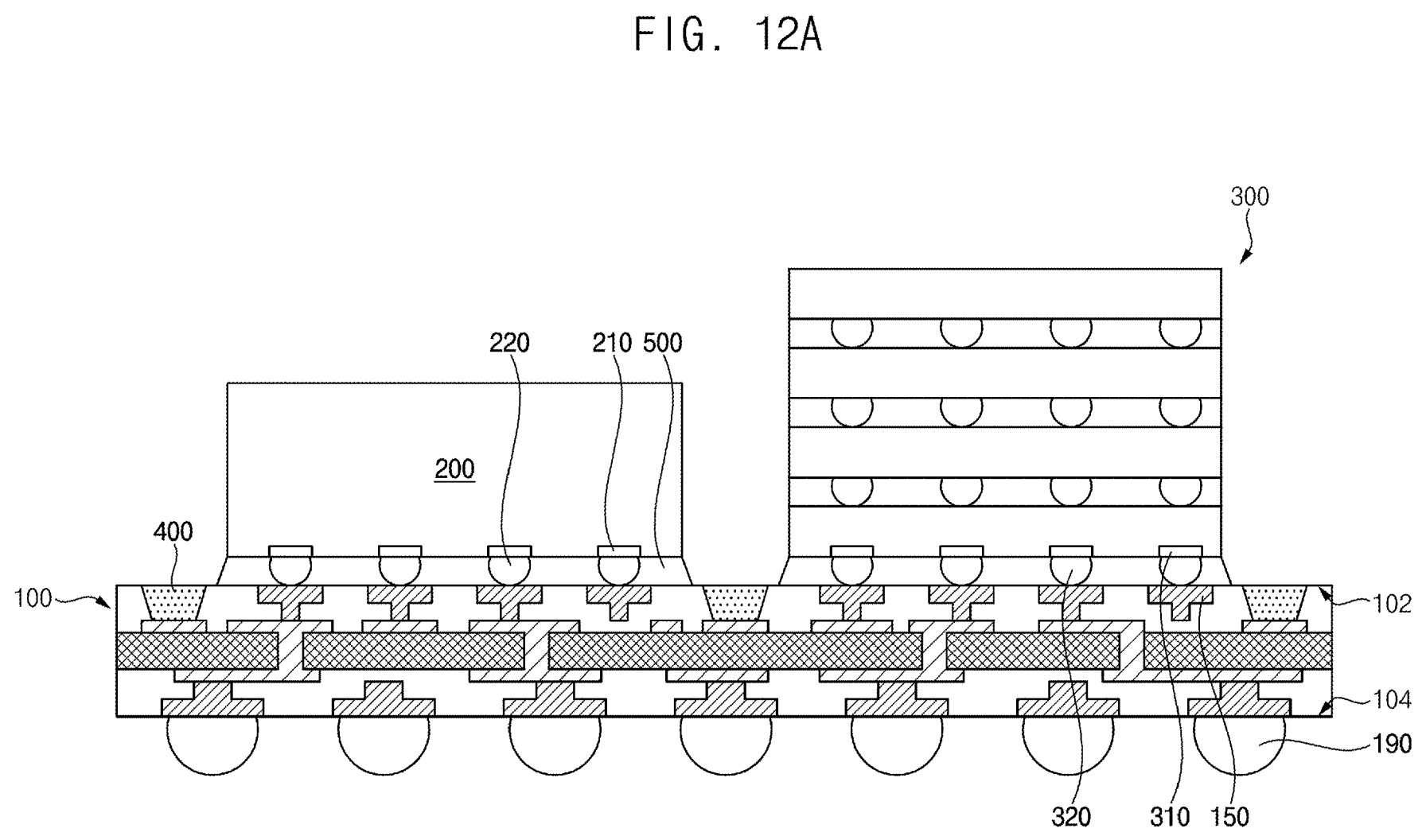
Figure 12B:
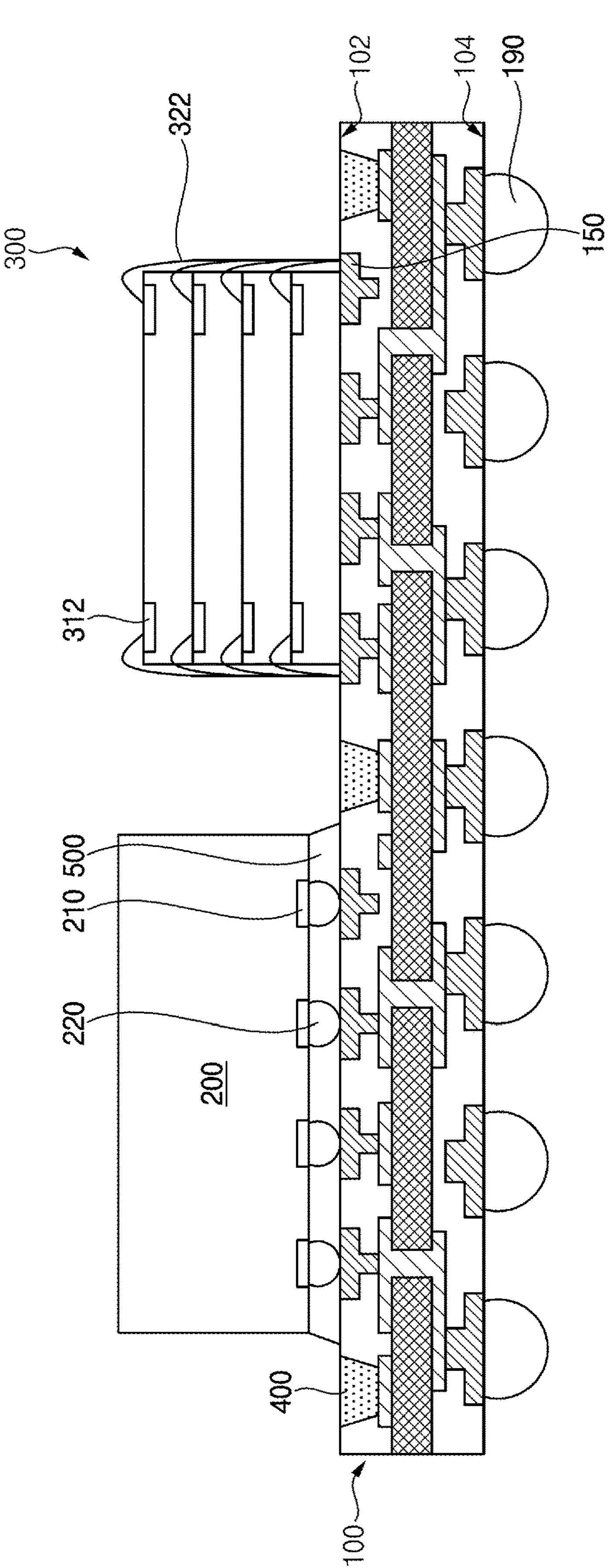

Referring to FIGS. 12A and 12B, the first and second semiconductor devices 200, 300 may be mounted on the package substrate 100.

As illustrated in FIG. 12A, the first and second semiconductor devices 200, 300 may be mounted on the package substrate 100 by a flip chip bonding method. The first and second semiconductor devices 200, 300 may be attached on the package substrate 100 by a thermal compression process.

The first semiconductor device 200 may be bonded to the upper bonding pads 150 by first conductive bumps 220 provided on first chip pads 210. The second semiconductor device 300 may be bonded to the upper bonding pads 150 by second conductive bumps 320 provided on second chip pads 310. The first and second semiconductor devices 200, 300 may be electrically connected to each other through the upper bonding pads 150 and the upper conductive pattern 130 of the package substrate 100.

As illustrated in FIG. 12B, the first semiconductor device 200 may be mounted on the package substrate 100 by the flip chip bonding method, and the second semiconductor device 300 may be mounted on the package substrate 100 by a wire bonding method.

The second semiconductor device 300 may be mounted on the package substrate 100 such that an active surface on which the second chip pads 312 are formed faces the opposite direction of the package substrate 100. The second chip pads 312 of the second semiconductor device 300 may be electrically connected to the upper bonding pads 150 of the package substrate 100 by bonding wires 322 as conductive connection members.

The first semiconductor device 200 may have a first mass. The second semiconductor device 300 may have a second mass different from the first mass. When the first and second semiconductor devices 200, 300 have different masses, a center of gravity of the package substrate 100 may be biased in one direction. The reinforcing structure 400 may prevent a warpage phenomenon of the package substrate 100 that occurs when the center of gravity of the package substrate 100 is biased. The reinforcing structure 400 may prevent the warpage phenomenon of the package substrate 100 from occurring due to the center of gravity of the package substrate 100 being biased.

Then, an adhesive 500 may be underfilled between the first and second semiconductor devices 200, 300 and the package substrate 100. The adhesive 500 may reinforce gaps between the first and second semiconductor devices 200, 300 and the package substrate 100, respectively.

Then, the semiconductor package 10 in FIG. 1 may be completed by forming external connection bumps 190 such as solder balls on external connection pads on the lower surface of the package substrate 100.

Figure 13:
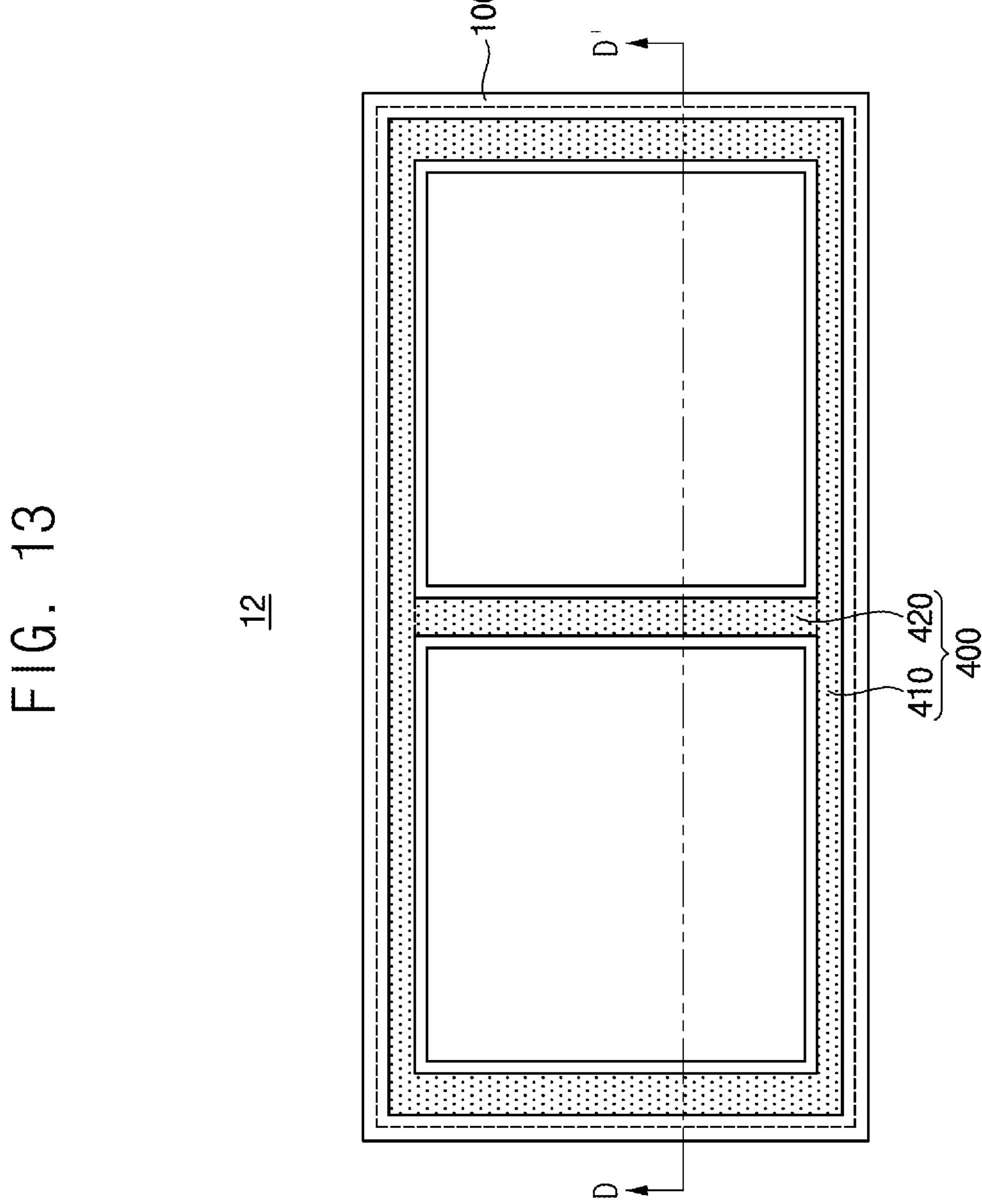
Figure 14:
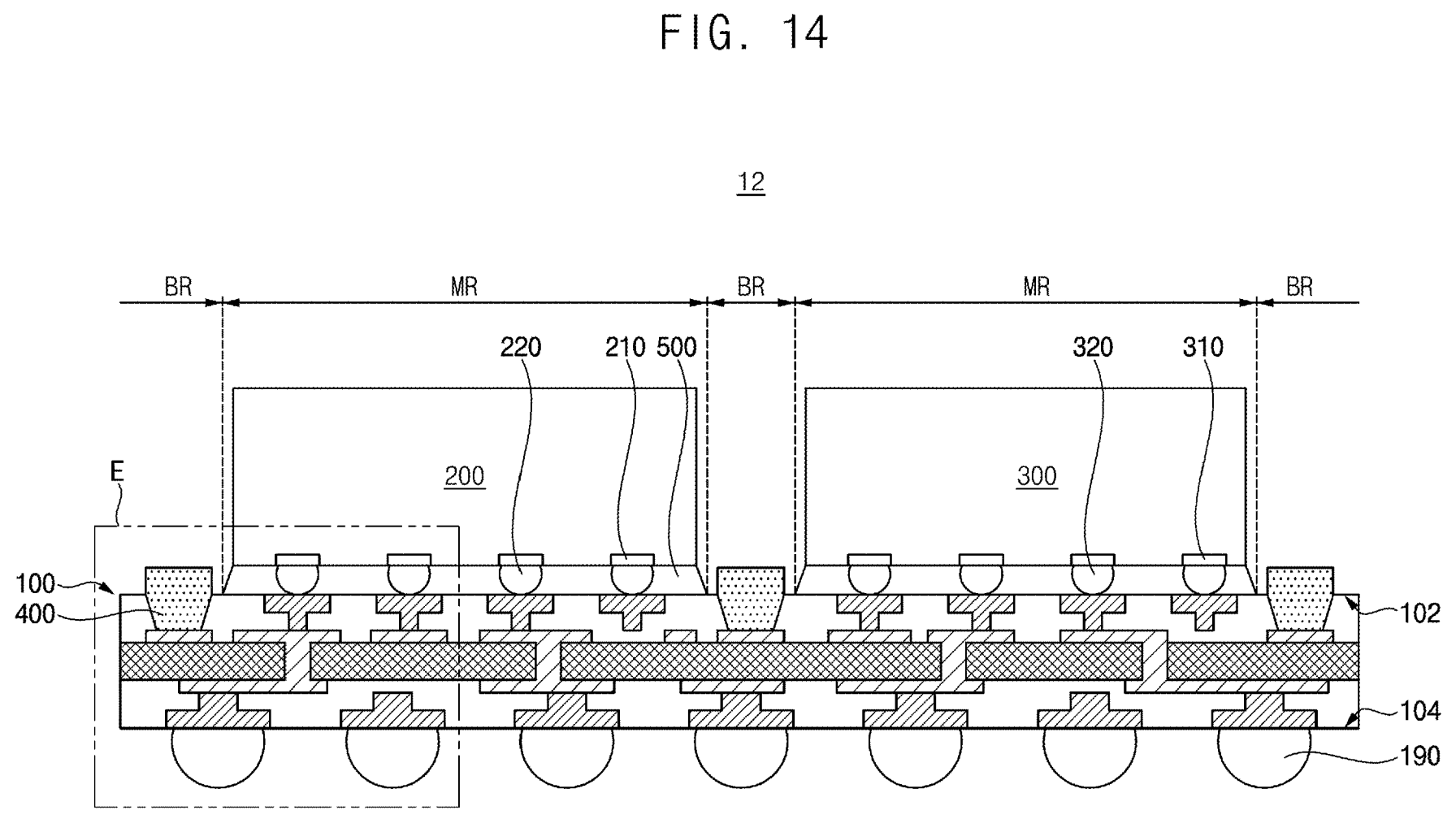
Figure 15:
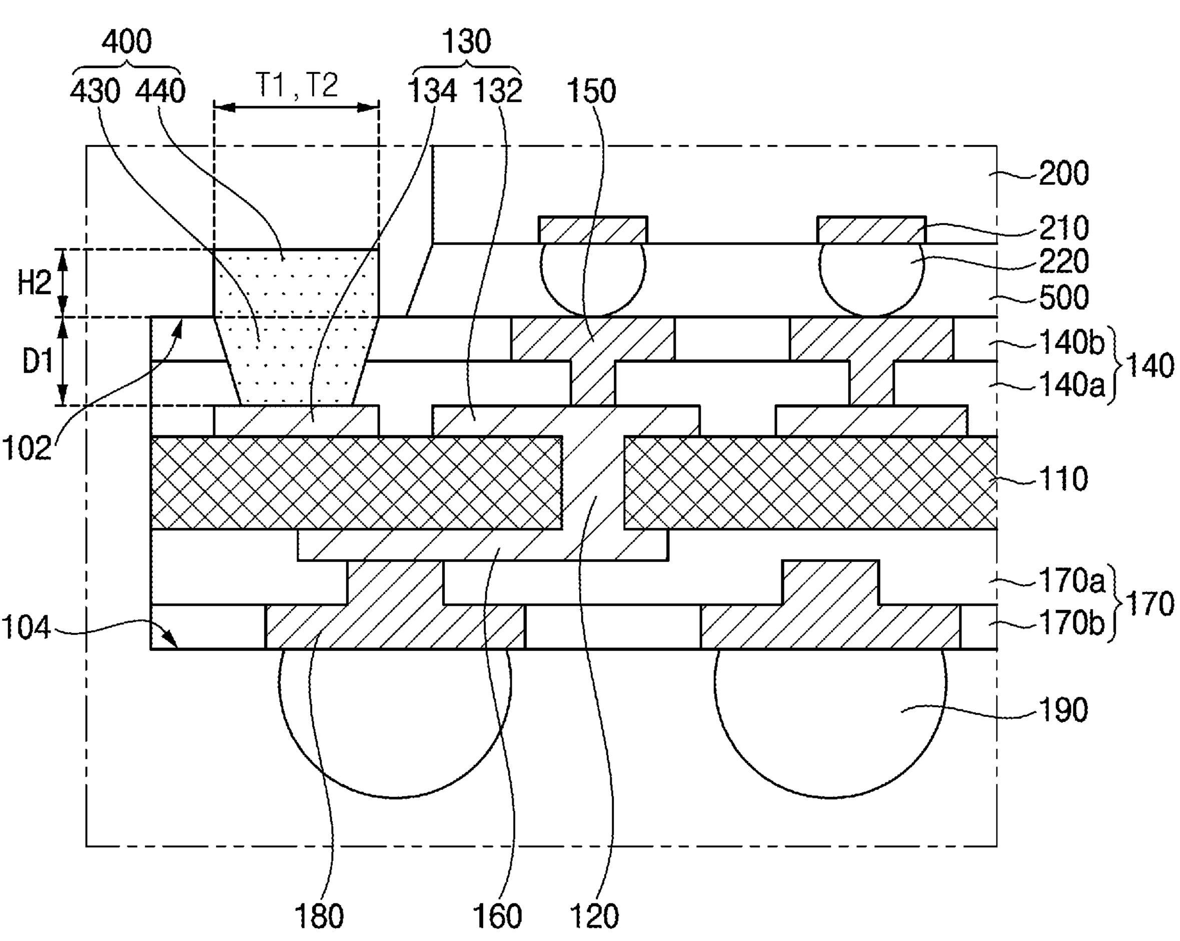

FIG. 13 is a plan view illustrating a semiconductor package having a protruding reinforcing structure in accordance with example embodiments. FIG. 14 is a cross-sectional view taken along the line D-D' in FIG. 13. FIG. 15 is an enlarged cross-sectional view illustrating a portion 'E' in FIG. 14. The semiconductor package may be substantially the same as or similar to the semiconductor package described with reference to FIGS. 1 to 3 except for a configuration of a protruding structure of the reinforcing structure 400. Thus, same or similar components may be denoted by the same or similar reference numerals, and repeated descriptions of the same components will be omitted.

In some example embodiments, the reinforcing structure 400 may extend inside the package substrate 100. The reinforcing structure 400 may extend in the boundary region BR between the mounting regions MR. The reinforcing structure 400 may extend from the upper surface 102 of the package substrate 100 along outside of each of the first and second semiconductor devices 200, 300.

The reinforcing structure 400 may include an embedded structure 430 that is inside the trench TR and the reinforcing structure 400 may include a protruding structure 440 that protrudes from and extends above an upper surface of the trench TR. An upper surface of the embedded structure 430 and a lower surface of the protruding structure 440 may be bonded to each other.

The embedded structure 430 may be formed on the first upper insulating layer 140*a* and may contact the dummy pattern 134 of the upper conductive pattern 130 through the first trench. The embedded structure 430 may not contact the wiring pattern 132 of the upper conductive pattern 130. Therefore, the electrical signal may not move or travel to the embedded structure 430. The embedded structure 430 may be bonded to the dummy pattern 134 and may be more strongly fixed within the package substrate 100. The embedded structure 430 may be supported by the dummy pattern 134 and may provide stronger support to the package substrate 100 inside the package substrate 100.

The embedded structure 430 may be provided inside the upper insulating layer 140. The upper surface of the embedded structure 430 and the upper surface of the upper insulating layer 140 may be provided on a same plane. The upper surface of the embedded structure 430 may be exposed from or by the upper surface of the first upper insulating layer 140*a*.

The embedded structure 430 may have a first depth D1 and a first width T1 and may be buried from the upper surface 102 of the package substrate 100. The first depth D1 of the embedded structure 430 may be within a range of 10 μm to 30 μm. For example, the first width T1 of the embedded structure 430 may be within a range of 200 μm to 500 μm.

The protruding structure 440 may be provided on the embedded structure 430. The protruding structure 440 may extend from the upper surface of the upper insulating layer 140 along the upper surface of the embedded structure 430. A cross-sectional shape of the protruding structure 440 may include a rectangular shape, a triangular shape, a trapezoidal shape, or the like.

The protruding structure 440 may receive heat from the embedded structure 430 and discharge or expel the heat to the outside. The protruding structure 440 may increase the heat discharging effect by increasing a surface area in contact with air. The protruding structure 440 and the embedded structure 430 may include the metal material to increase the heat discharging effect. For example, the metal material may include copper (Cu), aluminum (Al), tungsten (W), nickel (Ni), molybdenum (Mo), gold (Au), silver (Ag), chromium (Cr), tin (Sn) and titanium (Ti).

The protruding structure 440 may have a size sufficient to discharge the heat generated from the inside of the package substrate 100. The protruding structure 440 may have a second height H2 and a second width T2. The second height H2 of the protruding structure 440 may not contact the first and second semiconductor devices 200, 300. The second height H2 of the protruding structure 440 may be smaller than a height from the upper insulating layer 140 to the lower surfaces of the first and second semiconductor devices 200, 300. For example, the second width T2 of the protruding structure 440 may be within a range of 200 μm to 500 μm. The second height H2 of the protruding structure 440 may be within a range of 10 μm to 350 μm.

Hereinafter, a method of manufacturing the semiconductor package in FIG. 13 will be described.

FIGS. 16 to 19 are cross-sectional views illustrating a method of manufacturing the semiconductor package in FIG. 13 in accordance with example embodiments.

Figure 16:
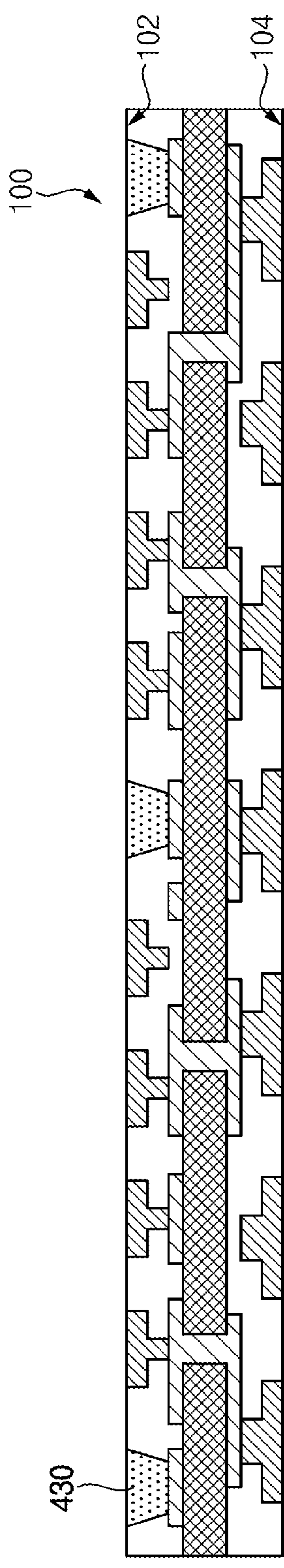

Referring to FIG. 16, the same or similar processes as those described with reference to FIGS. 4 to 11 may be performed to form the package substrate 100 having the reinforcing structure 400 having the embedded structure 430 formed therein. The upper surface of the embedded structure 430 may be exposed from the upper surface 102 of the package substrate 100.

Figure 17:
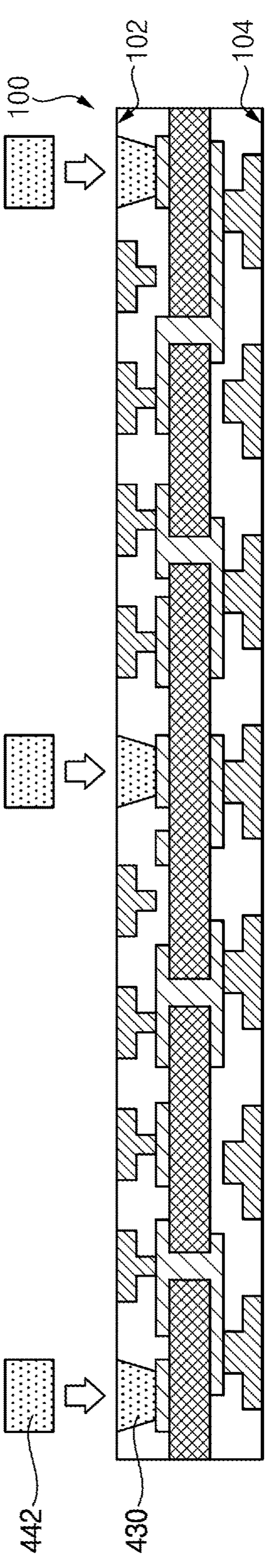
Figure 18:
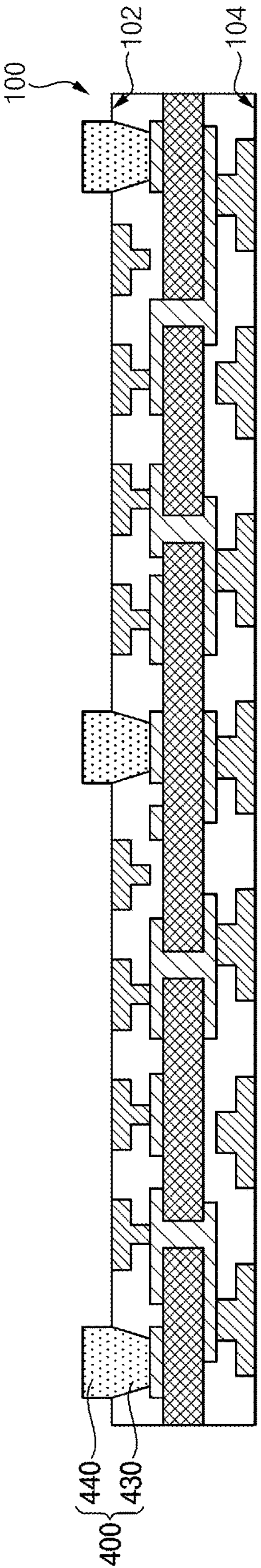

Referring to FIGS. 17 and 18, the protruding structure 440 may be formed on the embedded structure 430. A paste block 442 may be mounted on the embedded structure 430.

The paste block 442 may include a bar shape that extends along the embedded structure 430. A lower surface of the paste block 442 may be bonded to an upper surface of the embedded structure 430. The paste block 442 and the embedded structure 430 may include the same metal material. For example, the metal material may include copper (Cu), aluminum (Al), tungsten (W), nickel (Ni), molybdenum (Mo), gold (Au), silver (Ag), chromium (Cr), tin (Sn), and titanium (Ti).

Since the embedded structure 430 and the paste block 442 include the same metal, the embedded structure 430 and the paste block 442 may be bonded to each other at a high temperature. The embedded structure 430 and the paste block 442 may be bonded to each other through a reflow process or a curing process. The paste block 442 may be bonded to the embedded structure 430 and may form the protruding structure 440.

Figure 19:
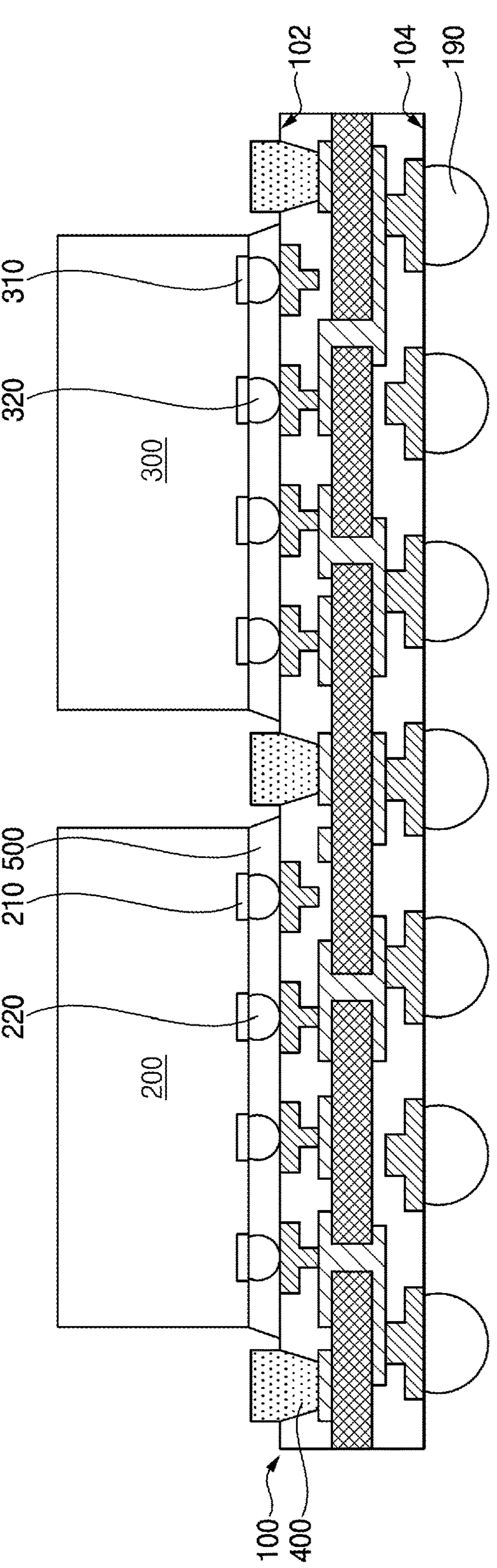

Referring to FIG. 19, the first and second semiconductor devices 200, 300 may be mounted on the package substrate 100 on which the embedded structure 430 and the protruding structure 440 are formed. The first and second semiconductor devices 200, 300 may be attached on the package substrate 100 by a thermal compression process.

Then, the adhesive 500 may be underfilled between the first and second semiconductor devices 200, 300 and the package substrate 100. The adhesive 500 may reinforce gaps between the first and second semiconductor devices 200, 300 and the package substrate 100, respectively.

Then, the semiconductor package 12 in FIG. 13 may be completed by forming external connection bumps 190 such as solder balls on external connection pads on the lower surface of the package substrate 100.

The foregoing is illustrative of example embodiments and is not to be construed as limiting of the presently disclosed inventive concepts. Although a few example embodiments have been described, those skilled in the art will readily appreciate that many modifications are possible in example embodiments without materially departing from the novel teachings and advantages of the present inventive concepts. Accordingly, all such modifications are intended to be included within the scope of the present disclosure as defined in the claims.

What is claimed is:

1. A semiconductor package, comprising:

a package substrate having a first surface and a second surface vertically opposite to each other, and having a first mounting region and a second mounting region horizontally spaced apart from each other; and first and second semiconductor devices respectively mounted on the first and second mounting regions on the first surface of the package substrate, wherein the package substrate includes, wiring patterns electrically connected to the first and second semiconductor devices;

dummy patterns electrically insulated from the first and second semiconductor devices; and a reinforcing structure that extends along perimeters of the first and second mounting regions on the first surface of the package substrate, and bonded to at least portions of the dummy patterns and, wherein at least a portion of the reinforcing structure is provided in a trench formed in the first surface of the package substrate, and the trench extends along the perimeters of the first and second mounting regions and surrounds the first mounting region and the second mounting region, and a bottom surface of the trench exposes at least portions of the dummy patterns, and wherein a thickness of the reinforcing structure is greater than a thickness of the dummy pattern.

2. The semiconductor package of claim 1, wherein each of the first and second semiconductor devices comprise respective conductive bumps that are bonded to bonding pads of the package substrate, and a minimum distance between the reinforcing structure and the bonding pads is within a range of 30 μm to 500 μm.

3. The semiconductor package of claim 1, wherein the reinforcing structure includes an embedded structure in the first surface of the package substrate, and the reinforcing structure includes a protruding structure that extends from the embedded structure and protrudes from the first surface.

4. The semiconductor package of claim 3, wherein a height of the protruding structure from the first surface is less than or equal to a height of lower surfaces of each of the first and second semiconductor devices from the first surface.

5. The semiconductor package of claim 1, wherein a width of the reinforcing structure is within a range of 200 μm to 500 μm.

6. The semiconductor package of claim 1, wherein the reinforcing structure includes a trapezoidal cross-sectional shape.

7. The semiconductor package of claim 1, wherein the reinforcing structure includes a metal material.

8. The semiconductor package of claim 1, wherein the first semiconductor device includes a logic semiconductor device, and wherein the second semiconductor device includes a memory semiconductor device.

9. The semiconductor package of claim 1, wherein the first and second semiconductor devices and the reinforcing structure at least partially overlap each other when viewed in a plan view.

10. A semiconductor package, comprising:

a package substrate having first and second surfaces vertically opposite to each other; and a semiconductor device on the first surface of the package substrate, wherein the package substrate includes, a reinforcing structure that extends from the first surface along a perimeter of the semiconductor device;

first conductive patterns electrically connected to the semiconductor device; and second conductive patterns bonded to the reinforcing structure and electrically insulated from the semiconductor device and, wherein at least a portion of the reinforcing structure is provided in a trench formed in the first surface of the package substrate, and the trench extends to surround the semiconductor device, and a bottom surface of the trench exposes at least portions of the second conductive patterns, and wherein a thickness of the reinforcing structure is greater than a thickness of the second conductive pattern.

11. The semiconductor package of claim 10, wherein the semiconductor device comprises conductive bumps that are bonded respectively to bonding pads of the package substrate, and wherein a minimum distance between the reinforcing structure and the bonding pads is in a range of 30 μm to 500 μm.

12. The semiconductor package of claim 10, wherein the reinforcing structure includes an embedded structure in the first surface of the package substrate and a protruding structure that protrudes from the embedded structure and extends above the first surface of the package substrate.

13. The semiconductor package of claim 12, wherein a height of the protruding structure above the first surface is less than or equal to a height of a lower surface of the semiconductor device from the first surface.

14. The semiconductor package of claim 10, wherein a horizontal width of the reinforcing structure is within a range of 200 μm to 500 μm.

15. The semiconductor package of claim 10, wherein the reinforcing structure includes a trapezoidal cross-sectional shape.

16. The semiconductor package of claim 10, wherein the reinforcing structure includes a metal material.

17. The semiconductor package of claim 16, wherein the reinforcing structure includes at least one of copper (Cu), aluminum (Al), tungsten (W), nickel (Ni), molybdenum (Mo), gold (Au), silver (Ag), chromium (Cr), tin (Sn), and/or titanium (Ti).

18. The semiconductor package of claim 10, wherein the semiconductor device and the reinforcing structure at least partially overlap each other when viewed in a plan view.

19. A semiconductor package, comprising:

a package substrate having first and second surfaces vertically opposite to each other; and first and second semiconductor devices horizontally spaced apart from each other on the first surface of the package substrate, wherein the package substrate includes, a trench formed in the first surface and extending along a perimeter of each of the first and second semiconductor devices, the trench having an upper portion open to the first surface and a lower portion opposite to the upper portion;

wiring patterns electrically connected to the first and second semiconductor devices;

dummy patterns exposed from the lower portion of the trench and electrically insulated from the first and second semiconductor devices; and a reinforcing structure in the trench and, wherein the trench extends to surround the first semiconductor device and the second semiconductor device, and a bottom surface of the trench exposes at least portions of the dummy patterns, and wherein a thickness of the reinforcing structure is greater than a thickness of the dummy pattern.

* * * * *